(12) United States Patent
Zhang et al.

(10) Patent No.: US 11,355,478 B2
(45) Date of Patent: Jun. 7, 2022

(54) MICRO LIGHT EMITTING DIODE DISPLAY PANEL, METHOD FOR FABRICATING SAME, AND DISPLAY DEVICE

(71) Applicant: TCL CHINA STAR OPTOELECTRONICS TECHNOLOGY CO., LTD., Shenzhen (CN)

(72) Inventors: Wei Zhang, Shenzhen (CN); Macai Lu, Shenzhen (CN); Minggang Liu, Shenzhen (CN); Chunche Hsu, Shenzhe (CN); Chiayu Lee, Shenzhen (CN)

(*) Notice: Subject to any disclaimer, the term of this patent is extended or adjusted under 35 U.S.C. 154(b) by 300 days.

(21) Appl. No.: 16/615,276

(22) PCT Filed: Jul. 18, 2019

(86) PCT No.: PCT/CN2019/096460
§ 371 (c)(1),
(2) Date: Nov. 20, 2019

(87) PCT Pub. No.: WO2020/215502
PCT Pub. Date: Oct. 29, 2020

(65) Prior Publication Data
US 2021/0398952 A1 Dec. 23, 2021

(30) Foreign Application Priority Data
Apr. 26, 2019 (CN) .......................... 201910345519.6

(51) Int. Cl.
*H01L 25/075* (2006.01)
*H01L 27/12* (2006.01)
*H01L 29/786* (2006.01)
*H01L 33/62* (2010.01)

(52) U.S. Cl.
CPC ...... *H01L 25/0753* (2013.01); *H01L 27/1214* (2013.01); *H01L 29/78633* (2013.01); *H01L 33/62* (2013.01); *H01L 2933/0066* (2013.01)

(58) Field of Classification Search
CPC ............ H01L 25/0753; H01L 27/1214; H01L 29/78633; H01L 33/62; H01L 2933/0066
See application file for complete search history.

(56) References Cited

U.S. PATENT DOCUMENTS

| | | | |
|---|---|---|---|
| 2018/0175268 A1* | 6/2018 | Moon | H01L 25/0753 |
| 2018/0188606 A1* | 7/2018 | Lee | G02F 1/133608 |
| 2019/0019813 A1* | 1/2019 | Ren | H01L 27/1225 |
| 2019/0214376 A1* | 7/2019 | Kim | H01L 27/1259 |
| 2019/0333945 A1* | 10/2019 | Liu | G06F 3/04164 |

* cited by examiner

*Primary Examiner* — Victor A Mandala
(74) *Attorney, Agent, or Firm* — JMB Davis Ben-David

(57) ABSTRACT

The present disclosure provides a micro light emitting diode display panel, a method for fabricating the same, and a display device comprising the same. The micro light emitting diode display panel includes an active layer, a gate insulating layer, a gate electrode, a source electrode, a drain electrode, a pixel electrode, a micro light emitting diode, and a gate insulating layer covering the active layer, the gate insulating layer, the gate electrode, the source electrode, and the drain electrode. The light shielding layer blocks light emitted by the micro light emitting diode from being incident on the thin film transistor, thereby reducing influence of the light emitted by the micro light emitting diode light on the thin film transistor.

17 Claims, 14 Drawing Sheets

MICRO LIGHT EMITTING DIODE DISPLAY PANEL, METHOD FOR FABRICATING SAME, AND DISPLAY DEVICE

CROSS-REFERENCE TO RELATED APPLICATIONS

This is the U.S. National Stage of International Patent Application No. PCT/CN2019/096460, filed Jul. 18, 2019, which in turn claims the benefit of Chinese Patent Application No. 201910345519.6 filed Apr. 26, 2019.

FIELD OF INVENTION

The present disclosure relates to a field of display technology, and particularly to a micro light emitting diode display panel, a method for fabricating the same, and a display device comprising the same.

BACKGROUND

A current micro light emitting diode (micro LED) display panel is a self-emitting display device that displays an image using a high-density micro light-emitting diode array integrated on a substrate as display pixels.

Because light emitted by a micro light emitting diode is omni-directional, a thin film transistor (TFT) in a thin film transistor array is subjected to short-wavelength light emitted by the micro-light-emitting diode to cause a shift in threshold voltage (Vth), thereby causing a light leakage current to become large and affecting the display effect.

That is, the current micro light emitting diode display panel has a technical problem that the light emitted by the micro light emitting diode causes the shift of the threshold voltage of the thin film transistor, and needs improvement.

SUMMARY OF DISCLOSURE

The present disclosure provides a micro light emitting diode display panel, a method for fabricating the same, and a display device comprising the same, to solve the technical problem of the current micro light emitting diode display panel that the light emitted by the micro light emitting diode causes the shift of the threshold voltage of the thin film transistor.

In order to solve the aforementioned technical problem, the present disclosure provides technical solutions as follow.

The present disclosure provides a method for fabricating a micro light emitting diode display panel, comprising:
  providing a substrate;
  forming an active layer, a gate insulating layer, a gate electrode, a source electrode, and a drain electrode in sequence on the substrate;
  forming a first passivation layer above the substrate, wherein the first passivation layer is provided with a first via hole, and covers the source electrode and the drain electrode;
  forming a pixel electrode above the substrate, wherein the pixel electrode is connected to the drain electrode or the source electrode through the first via hole;
  forming a light shielding layer above the substrate, wherein the light shielding layer covers the active layer, the gate insulating layer, the gate electrode, the source electrode, and the drain electrode;
  disposing a micro light emitting diode above the substrate, wherein the micro light emitting diode is connected to the pixel electrode.

In an embodiment, the method for fabricating the micro light emitting diode display panel further comprises:
forming a second passivation layer on the pixel electrode before the step of forming the light shielding layer above the substrate; wherein the second passivation layer is provided with a second via hole, and the micro light emitting diode is connected to the pixel electrode through the second via hole.

In an embodiment, the method for fabricating the micro light emitting diode display panel further comprises:
forming a metal electrode on the pixel electrode before the step of forming the second passivation layer on the pixel electrode, wherein the micro light emitting diode is connected to the pixel electrode through the second via hole and the metal electrode.

In an embodiment, the method for fabricating the micro light emitting diode display panel further comprises:
forming a third passivation layer on the light shielding layer after the step of forming the light shielding layer above the substrate, wherein the third passivation layer covers the light shielding layer and a portion of the second passivation layer.

The present disclosure further provides a micro light emitting diode display panel, comprising:
  a substrate;
  an active layer disposed on the substrate;
  a gate insulating layer disposed on the active layer;
  a gate electrode disposed on the gate insulating layer;
  a source electrode disposed on the active layer;
  a drain electrode disposed on the active layer;
  a first passivation layer covering the source electrode and the drain electrode, wherein the first passivation layer is provided with a first via hole;
  a pixel electrode connected to the drain electrode or the source electrode through the first via hole;
  a light shielding layer covering the active layer, the gate insulating layer, the gate electrode, the source electrode, and the drain electrode; and
  a micro light emitting diode connected to the pixel electrode.

In an embodiment, the micro light emitting diode display panel further comprises: a second passivation layer disposed on the pixel electrode, provided with a second via hole, wherein the micro light emitting diode is connected to the pixel electrode through the second via hole.

In an embodiment, the micro light emitting diode display panel further comprises: a metal electrode disposed on the pixel electrode, wherein the micro light emitting diode is connected to the pixel electrode through the second via hole and the metal electrode.

In an embodiment, the micro light emitting diode display panel further comprises a third passivation layer disposed on the light shielding layer and covering the light shielding layer and a portion of the second passivation layer.

In an embodiment, a projection of the pixel electrode on the substrate coincides with that of the source electrode or the drain electrode on the substrate, and the light shielding layer covers a portion of the second passivation layer.

In an embodiment, the light shielding layer is composed of a black photoresist.

The present disclosure further provides a display device, comprising:
  a micro light emitting diode display panel, comprising:
  a substrate;
  an active layer disposed on the substrate;
  a gate insulating layer disposed on the active layer;
  a gate electrode disposed on the gate insulating layer;
  a source electrode disposed on the active layer;
  a drain electrode disposed on the active layer;

a first passivation layer covering the source electrode and the drain electrode, wherein the first passivation layer is provided with a first via hole;

a pixel electrode connected to the drain electrode or the source electrode through the first via hole;

a light shielding layer covering the active layer, the gate insulating layer, the gate electrode, the source electrode, and the drain electrode; and a micro light emitting diode connected to the pixel electrode.

In an embodiment, the micro light emitting diode display panel further comprising:

a second passivation layer disposed on the pixel electrode, provided with a second via hole, wherein the micro light emitting diode is connected to the pixel electrode through the second via hole.

In an embodiment, the micro light emitting diode display panel further comprising:

a metal electrode disposed on the pixel electrode, wherein the micro light emitting diode is connected to the pixel electrode through the second via hole and the metal electrode.

In an embodiment, the micro light emitting diode display panel further comprising:

a third passivation layer disposed on the light shielding layer, covering the light shielding layer and a portion of the second passivation layer.

In an embodiment, a projection of the pixel electrode on the substrate coincides with that of the source electrode or the drain electrode on the substrate, and the light shielding layer covers a portion of the second passivation layer.

In an embodiment, the light shielding layer is disposed on the first passivation layer, and the pixel electrode is disposed on the light shielding layer and is connected to the drain electrode or the drain electrode through a via hole penetrating the light shielding layer and the first passivation layer.

In an embodiment, the light shielding layer is disposed on the first passivation layer and the second passivation layer, and the micro light emitting diode is connected to the pixel electrode through a via hole penetrating the light shielding layer and the second passivation layer.

The present disclosure provides a micro light emitting diode display panel, a method for fabricating the same, and a display device comprising the same. The micro light emitting diode display panel comprises an active layer, a gate insulating layer, a gate electrode, a source electrode, a drain electrode, a pixel electrode, a micro light emitting diode, and a gate insulating layer. The active layer, the gate insulating layer, the gate electrode, the source electrode, and the drain electrode form a thin film transistor and are covered by the light shielding layer. The light shielding layer blocks light emitted by the micro light emitting diode from being incident on the thin film transistor, thereby reducing influence of the light emitted by the micro light emitting diode light on the thin film transistor, that is, reducing a shift in threshold voltage (Vth) caused by the micro light emitting diode illuminating the thin film transistor, and then reducing a light leakage current. Therefore, the technical problem of the current micro light emitting diode display panel that the light emitted by the micro light emitting diode causes the shift of the threshold voltage of the thin film transistor is solved, the light leakage current is reduced when the thin film transistor is turned off, and a contrast between bright and dark is improved.

BRIEF DESCRIPTION OF DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
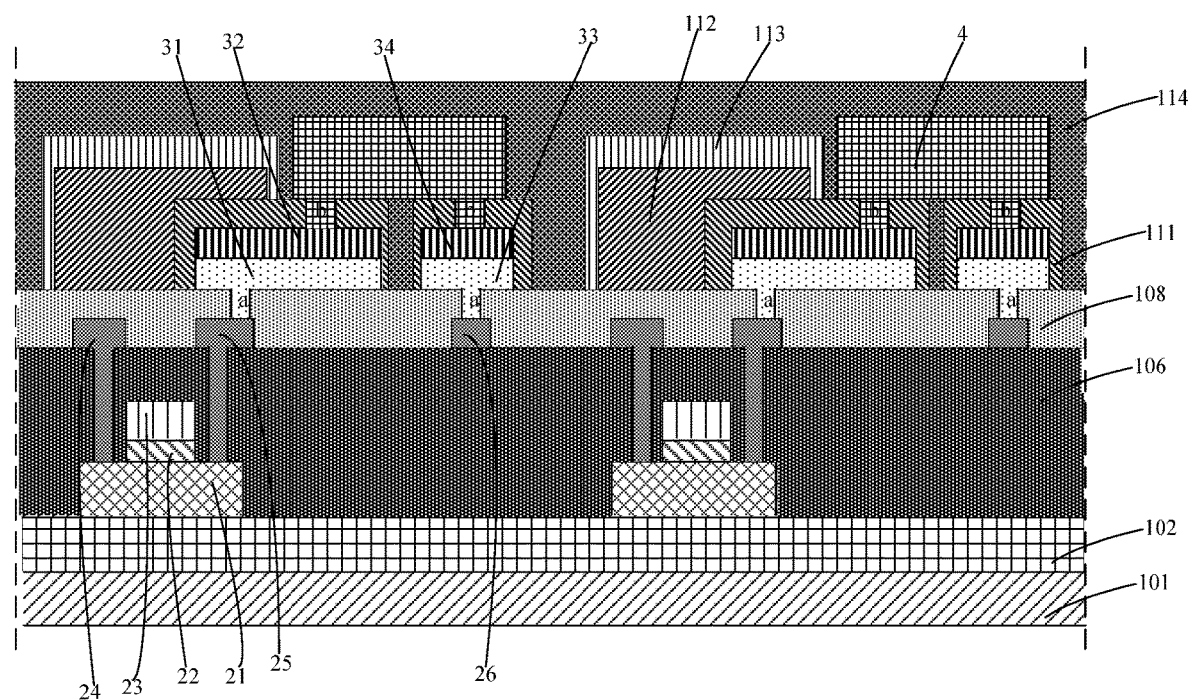
FIG. 1 is a cross-sectional side view of a first structure of a micro light emitting diode display panel according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals.

The embodiments of the present disclosure can solve the technical problem of the current micro light emitting diode display panel that the light emitted by the micro light emitting diode causes the shift of the threshold voltage of the thin film transistor.

As shown in FIG. 1, the present disclosure provides a micro light emitting diode display panel comprising:

a substrate 101, which may be a glass substrate, a flexible substrate or the like;

a thin film transistor disposed on the substrate 101, comprising an active layer 21, a gate insulating layer 22, a gate electrode 23, a source electrode 24, and a drain electrode 25;

a first passivation layer 108 covering the source electrode 24 and the drain electrode 25, wherein the first passivation layer 108 is provided with a first via hole a;

a pixel electrode 31 connected to the drain electrode 24 or the source electrode 25 through the first via hole a; when the thin film transistor is an N-type thin film transistor, the pixel electrode 31 is connected to the drain electrode 25 through the first via hole a, and when the thin film transistor is a P-type thin film transistor, the pixel electrode 31 is connected to the drain electrode 25 through the first via hole a;

a light shielding layer 112 covering the active layer 21, the gate insulating layer 22, the gate electrode 23, the source electrode 24, and the drain electrode 25; and a micro light emitting diode 4 connected to the pixel electrode 31.

This embodiment provides a micro light emitting diode display panel comprising an active layer 21, a gate insulating layer 22, a gate electrode 23, a source electrode 24, a drain electrode 25, a pixel electrode 31, a micro light emitting diode 4, and a light shielding layer 112. The active layer 21, the gate insulating layer 22, the gate electrode 23, the source electrode 24, and the drain electrode 25 form a thin film transistor and are covered by the light shielding layer 112. The light shielding layer 112 blocks light emitted by the micro light emitting diode 4 from being incident on the thin film transistor, thereby reducing influence of the light emitted by the micro light emitting diode 4 on the thin film transistor.

In an embodiment, when the pixel electrode 31 has a positive electric potential, the pixel electrode 31 is connected to the drain electrode 25 through the first via hole a, and when the pixel electrode 31 has a negative electric potential, the pixel electrode 31 is connected to the source electrode 24 through the first via hole a.

In an embodiment, as shown in FIG. 1, the micro light emitting diode display panel further comprises a second passivation layer 111 disposed on the pixel electrode 31 and provided with a second via hole b, wherein the micro light emitting diode 4 is connected to the pixel electrode 31 through the second via hole b.

In an embodiment, as shown in FIG. 1, the micro light emitting diode display panel further comprises a metal electrode 32 disposed on the pixel electrode 31, wherein the micro light emitting diode 4 is connected to the pixel electrode 31 through the second via hole b and the metal electrode 32.

In an embodiment, as shown in FIG. 1, the micro light emitting diode display panel further comprises a third passivation layer 113 disposed on the light shielding layer 112 and covering the light shielding layer 112 and a portion of the second passivation layer 111.

In an embodiment, as shown in FIG. 1, a projection of the pixel electrode 31 on the substrate 101 coincides with that of the source electrode 24 or the drain electrode 25 on the substrate 101, and the light shielding layer 112 covers a portion of the second passivation layer 111.

The micro light emitting diodes 4 may be a vertical micro light emitting diode or a horizontal micro light emitting diode. A first electrode and a second electrode of the vertical micro light emitting diode are located on upper and lower sides of the vertical micro light emitting diode, respectively. A first electrode and a second electrode of the horizontal micro light emitting diode are both located on a lower side of the horizontal micro light emitting diode.

In one embodiment, the micro light emitting diode 4 is a horizontal micro light emitting diode. The micro light emitting diode display panel further comprises a connection electrode 26 for connecting a common voltage source, and a transparent common electrode 33 connected to the connection electrode 26 through the first via hole a. The first electrode and the second electrode of the micro light emitting diode 4 is connected to the pixel electrode 31 and the transparent common electrode 33, respectively.

In an embodiment, as shown in FIG. 1, the second passivation layer 111 is further disposed on the transparent common electrode 33. The second electrode of the micro light emitting diode 4 is connected to the transparent common electrode 33 through the second via hole b.

In an embodiment, as shown in FIG. 1, the micro light emitting diode display panel further comprises a metal common electrode 34 disposed on the transparent common electrode 33. The second electrode of the micro light emitting diode 4 is connected to the transparent common electrode 33 through the second via hole b and the metal common electrode 34.

In an embodiment, the micro light emitting diode 4 is an inverted horizontal micro light emitting diode to improve light extraction efficiency.

In one embodiment, the micro light emitting diode 4 is a vertical micro light emitting diode. The micro light emitting diode display panel further comprises a transparent common electrode 33. The first electrode and the second electrode of the micro light emitting diode 4 is connected to the pixel electrode 31 and the transparent common electrode 33, respectively.

In an embodiment, the thin film transistor may be a driving thin film transistor, a switching thin film transistor, a sensing thin film transistor, or the like. The driving thin film transistor comprises a metal oxide semiconductor thin film transistor or the like. The switching thin film transistor comprises a low temperature polysilicon thin film transistor or the like.

In an embodiment, the micro light emitting diode display panel comprises sub-pixel units arranged in an array. One sub-pixel unit comprises one micro light emitting diode 4 and at least one driving thin film transistor. The driving thin film transistor drives the micro light emitting diode 4 to emit light.

In an embodiment, the pixel electrode 31 and the transparent common electrode 33 may be composed of indium tin oxide, indium zinc oxide, aluminum zinc oxide, or the like.

In an embodiment, the metal electrode 32 and the metal common electrode 34 may be composed of a copper-molybdenum stack, a copper-molybdenum-titanium stack, a copper-titanium stack, an aluminum-molybdenum stack, a copper-niobium alloy, a nickel-chromium alloy, or the like.

In an embodiment, the light shielding layer 112 is composed of a black photoresist.

In an embodiment, as shown in FIG. 1, the micro light emitting diode display panel further comprises a buffer layer 102 disposed on the substrate 101. The active layer 21, the gate insulating layer 22, the gate electrode 23, the source electrode 24, and the drain electrode 25 are disposed on the buffer layer 102.

In an embodiment, as shown in FIG. 1, the micro light emitting diode display panel further comprises an intermediate dielectric layer 106 disposed on the gate electrode 23. The source electrode 24 and the drain electrode 25 are disposed on the intermediate dielectric layer 106.

In an embodiment, as shown in FIG. 1, the micro light emitting diode display panel further comprises an encapsulation layer 114, which may be an organic/inorganic alternately deposited water and oxygen-proof mechanical collision protection film for encapsulating micro light emitting diode 4.

In order to fabricate the micro light emitting diode display panel shown in FIG. 1, the present disclosure further provides a method for fabricating a micro light emitting diode display panel comprising the following steps:

Step 1: providing a substrate;

Step 2: forming an active layer, a gate insulating layer, a gate electrode, a source electrode, and a drain electrode in sequence on the substrate;

Step 3: forming a first passivation layer above the substrate, wherein the first passivation layer is provided with a first via hole, and covers the source electrode and the drain electrode;

Step 4: forming a pixel electrode and a light shielding layer above the substrate, wherein the pixel electrode is connected to the drain electrode or the source electrode through the first via hole, and the light shielding layer covers the active layer, the gate insulating layer, the gate electrode, the source electrode, and the drain electrode;

Step 5: disposing a micro light emitting diode above the substrate, wherein the micro light emitting diode is connected to the pixel electrode.

In an embodiment, Step 4 comprises:

Step 41: forming a pixel electrode above the substrate, wherein the pixel electrode is connected to the drain electrode or the source electrode through the first via hole; and Step 42: forming a light shielding layer above the substrate, wherein the light shielding layer covers the active layer, the gate insulating layer, the gate electrode, the source electrode, and the drain electrode.

In an embodiment, before Step 42, the method for fabricating the micro light emitting diode display panel further comprises:

Step 43: forming a second passivation layer on the pixel electrode, wherein the second passivation layer is provided with a second via hole, and the micro light emitting diode is connected to the pixel electrode through the second via hole.

In an embodiment, before Step 43, the method for fabricating the micro light emitting diode display panel further comprises:

Step 44: forming a metal electrode on the pixel electrode, wherein the micro light emitting diode is connected to the pixel electrode through the second via hole and the metal electrode.

In an embodiment, after Step 42, the method for fabricating the micro light emitting diode display panel further comprises:

Step 45: forming a third passivation layer on the light shielding layer, wherein the third passivation layer covers the light shielding layer and a portion of the second passivation layer.

A method for fabricating a micro light emitting diode display panel provided by the present disclosure will be described by taking a metal oxide semiconductor thin film transistor as a thin-film transistor and taking a horizontal micro light emitting diode as a micro light emitting diode.

As shown in FIG. 2 to FIG. 24, the method for fabricating a micro light emitting diode display panel provided by the present disclosure comprises the following steps.

Figure 2:
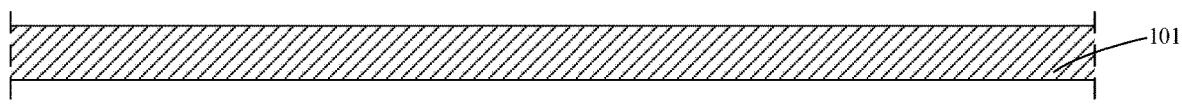
FIGS. 2 to 24 are schematic flowcharts of a method for fabricating the micro light emitting diode display panel of FIG. 1.

As shown in FIG. 2, providing a substrate 101.

The substrate 101 may be a glass substrate, a flexible substrate, or the like, and is subjected to treatments such as cleaning.

Figure 3:
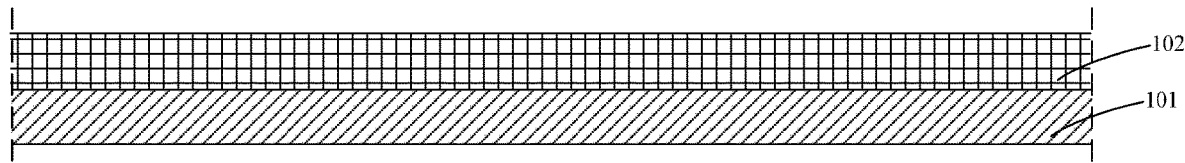

As shown in FIG. 3, depositing a buffer layer 102 on the substrate 101.

The buffer layer 102 may be composed of silicon oxide, a silicon nitride/silicon oxide stack, an aluminum oxide/silicon oxide stack, or the like.

Figure 4:
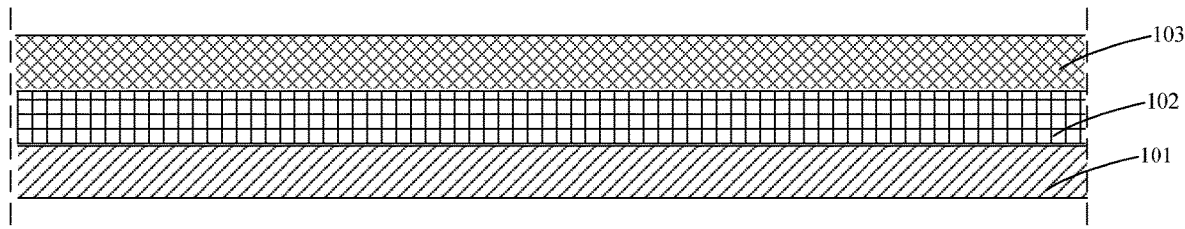

As shown in FIG. 4, depositing a metal oxide semiconductor layer 103 on the buffer layer 102.

The metal oxide semiconductor layer 103 may be composed of indium gallium zinc oxide, indium zinc oxide, indium gallium oxide, indium gallium titanium oxide, indium gallium zinc titanium oxide, or the like.

Figure 5:
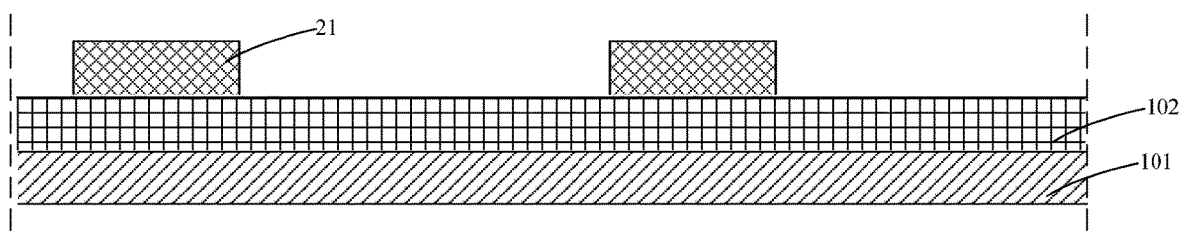

As shown in FIG. 5, processing the metal oxide semiconductor layer 103 to form the active layer 21.

The active layer 21 comprises an N-doped region, a P-doped region, and a channel region between the N-doped region and the P-doped region.

Figure 6:
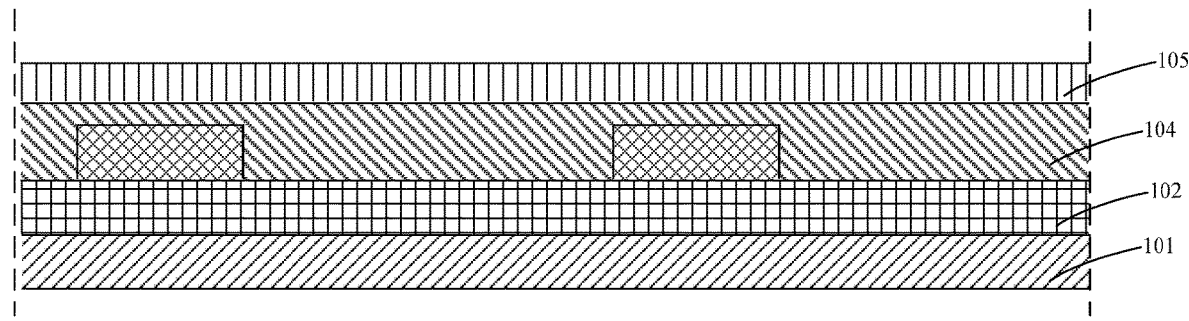

As shown in FIG. 6, depositing an insulating layer 104 and a metal layer 105 on the buffer layer 102 and the active layer 21.

The insulating layer 104 may be composed of silicon oxide, a silicon nitride/silicon oxide stack, an aluminum oxide/silicon oxide stack, or the like. The first metal layer 105 may be composed of a copper-molybdenum stack, a copper-molybdenum-titanium stack, a copper-titanium stack, an aluminum-molybdenum stack, a copper-niobium alloy or the like.

Figure 7:
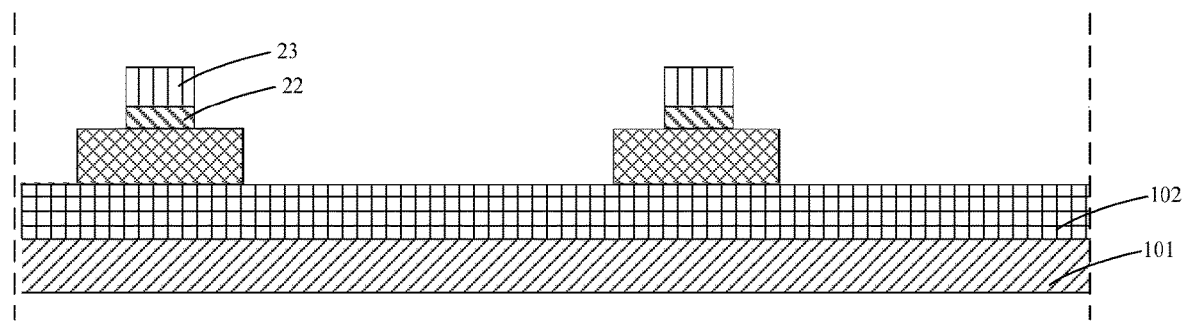

As shown in FIG. 7, patterning the insulating layer 104 to form a gate insulating layer 22, and patterning the metal layer 105 to form a gate electrode 23.

Figure 8:
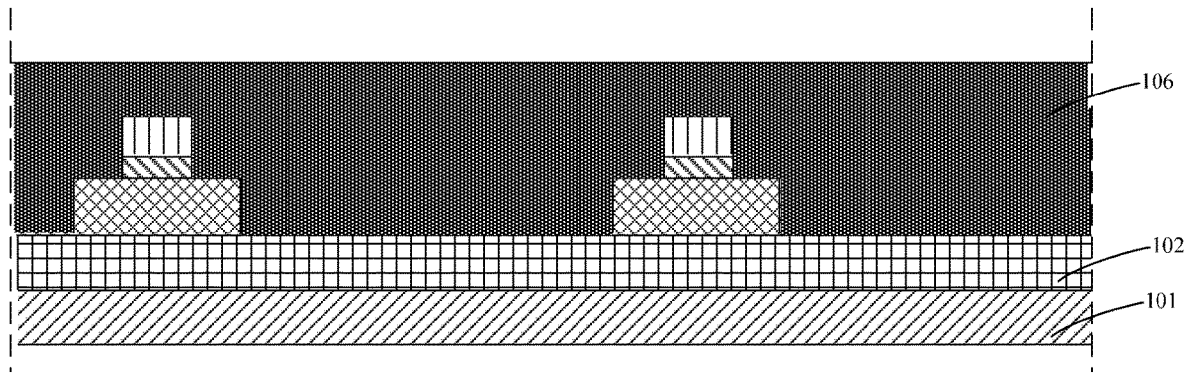

As shown in FIG. 8, depositing an intermediate dielectric layer 106 on the buffer layer 102, the active layer 21, the gate insulating layer 22, and the gate electrode 23.

The intermediate dielectric layer 106 may be composed of silicon oxide, a silicon nitride/silicon oxide stack, or the like.

Figure 9:
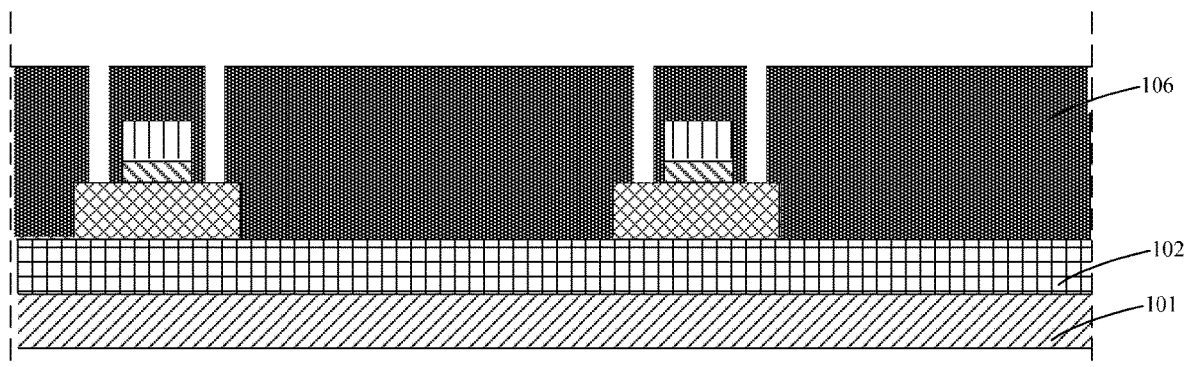

As shown in FIG. 9, patterning the intermediate dielectric layer 106 to form openings corresponding to the N-doped region and the P-doped region.

Figure 10:
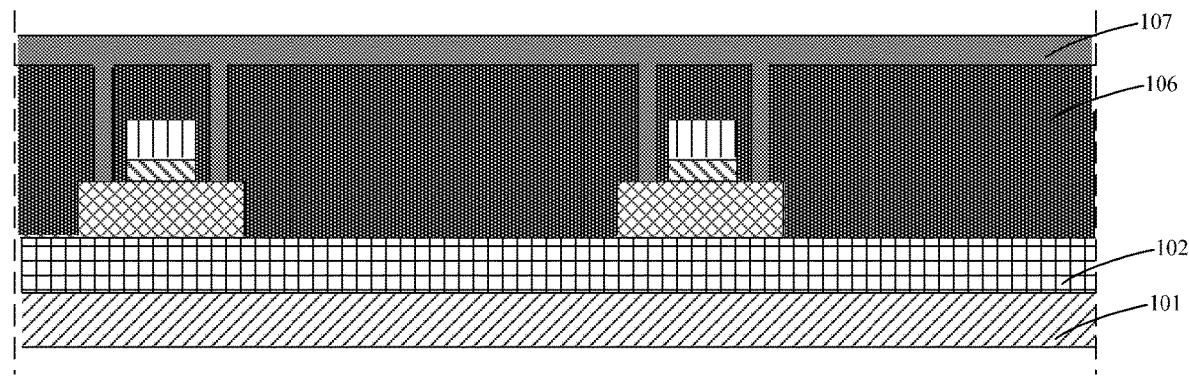

As shown in FIG. 10, depositing a metal layer 107 on the intermediate dielectric layer 106.

The metal layer 107 may be composed of a copper-molybdenum stack, a copper-molybdenum-titanium stack, a copper-titanium stack, an aluminum-molybdenum stack, a copper-niobium alloy or the like.

Figure 11:
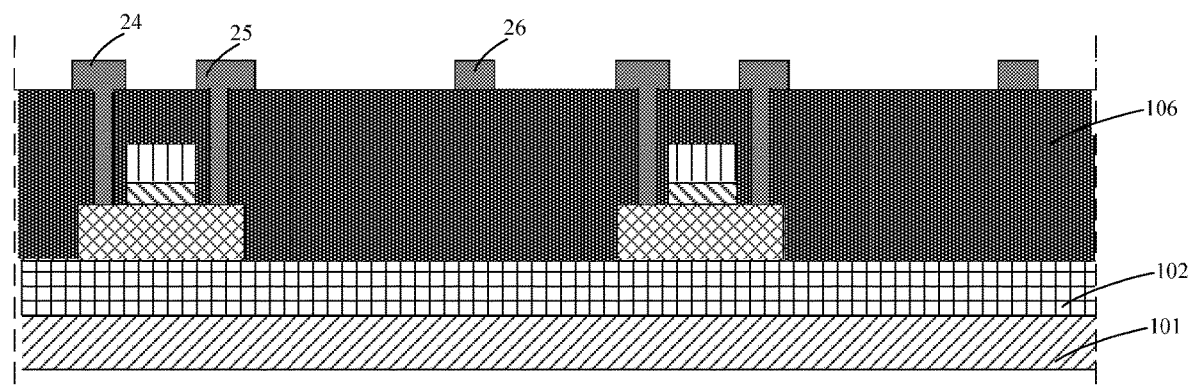

As shown in FIG. 11, patterning the metal layer 107 to form a source electrode 24, a drain electrode 25, and a connection electrode 26.

Figure 12:
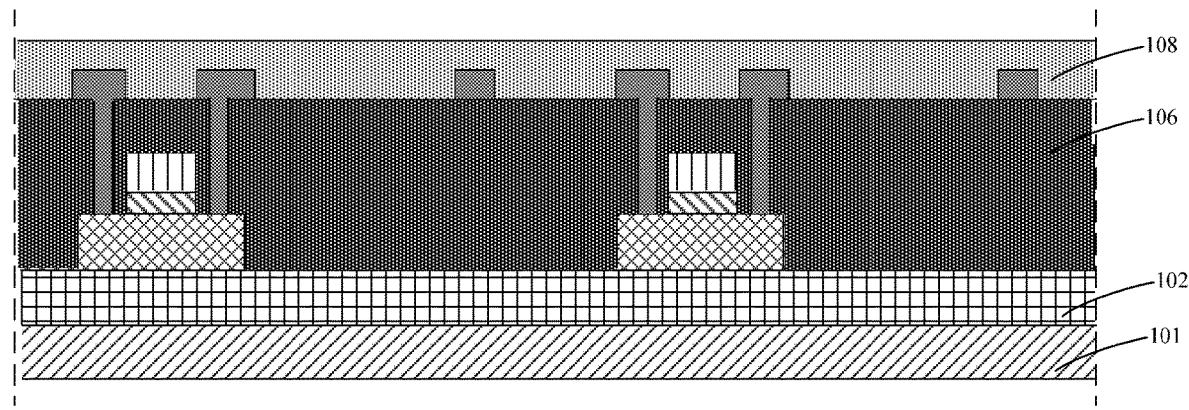

As shown in FIG. 12, depositing a first passivation layer 108 on the intermediate dielectric layer 106, the source 24, the drain 25, and the connection electrode 26.

The first passivation layer 108 may be composed of silicon oxide, silicon nitride, a silicon nitride/silicon oxide stack.

Figure 13:
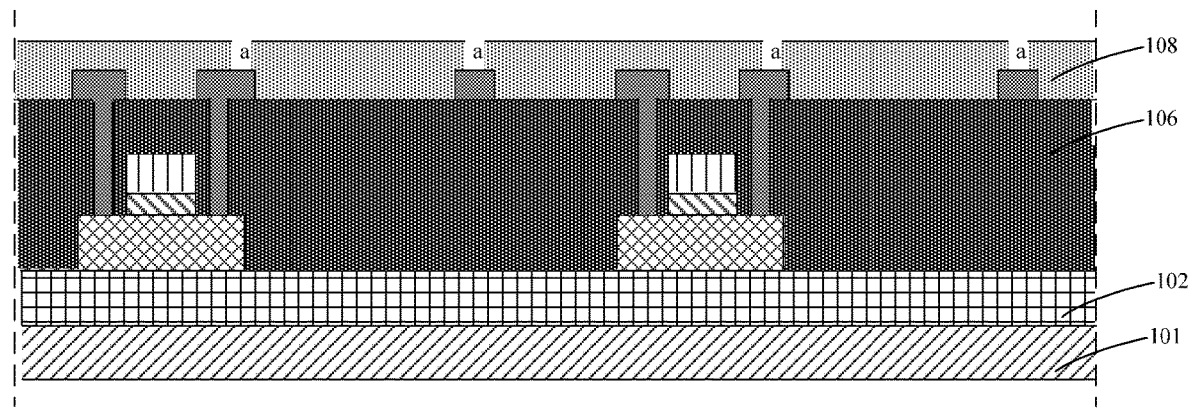

As shown in FIG. 13, patterning the first passivation layer 108 to form first via holes a corresponding to the drain electrode 25 and the connection electrode 26.

Figure 14:
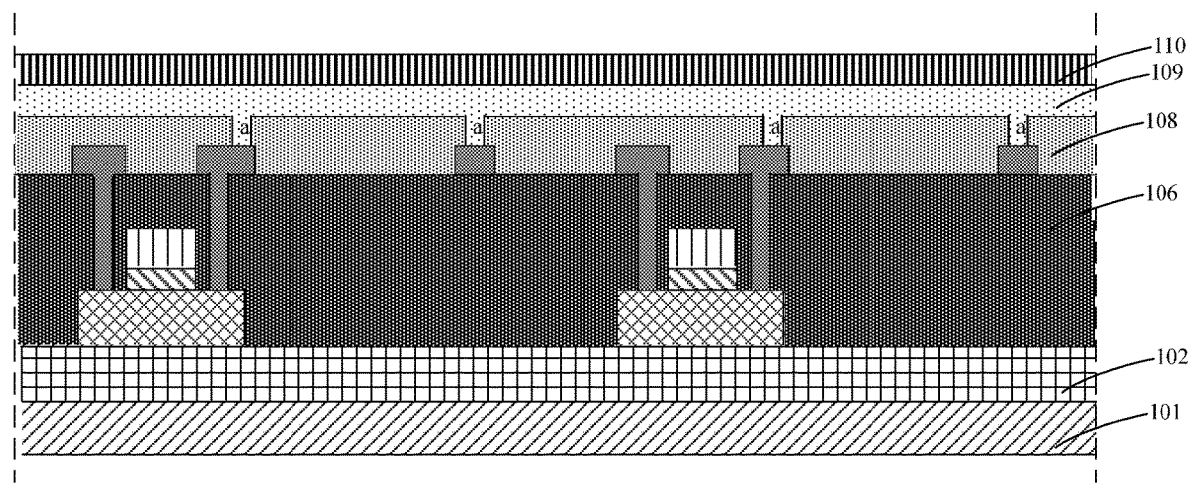

As shown in FIG. 14, depositing a transparent conductive layer 109 and a metal layer 110 on the first passivation layer 108.

The transparent conductive layer 109 may be composed of indium tin oxide, indium zinc oxide, aluminum zinc oxide or the like. The metal layer 110 may be composed of copper-molybdenum stack, a copper-molybdenum-titanium stack, a copper-titanium stack, an aluminum-molybdenum stack, a copper-niobium alloy, a nickel-chromium alloy, or the like.

Figure 15:
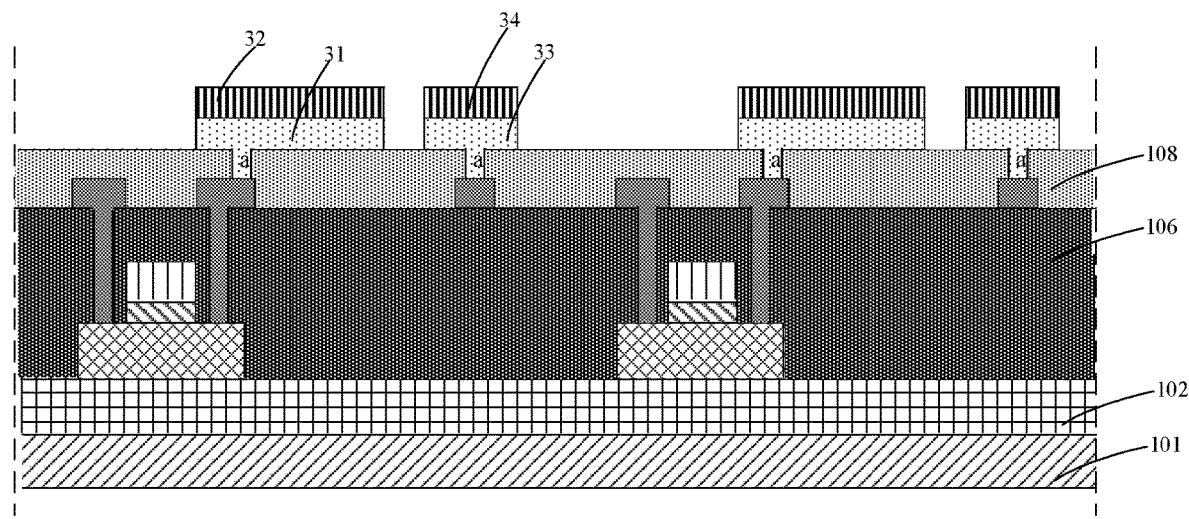

As shown in FIG. 15, patterning the transparent conductive layer 109 to form a pixel electrode 31 and a transparent common electrode 33 and patterning the metal layer 110 form a metal electrode 32 and a metal common electrode 34.

The pixel electrode 31 is connected to the drain electrode 25 through one of the first via holes a, and the transparent common electrode 33 is connected to the connection electrode 26 through the other first via hole a.

Figure 16:
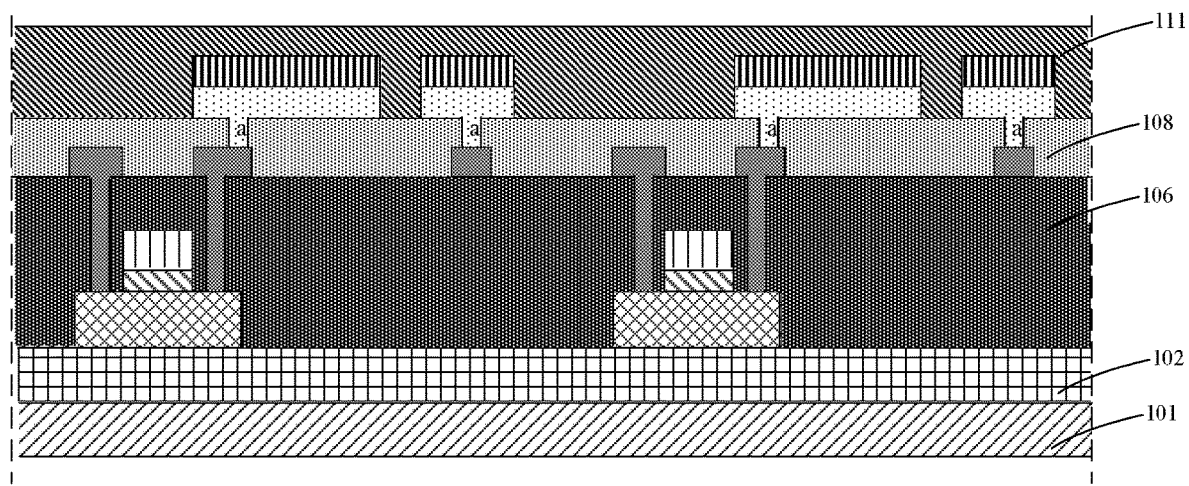

As shown in FIG. 16, depositing a second passivation layer 111 on the first passivation layer 108, the metal electrode 32, and the metal common electrode 34.

The second passivation layer 111 may be composed of silicon oxide, silicon nitride, aluminum oxide, a silicon nitride silicon oxide stack or the like.

Figure 17:
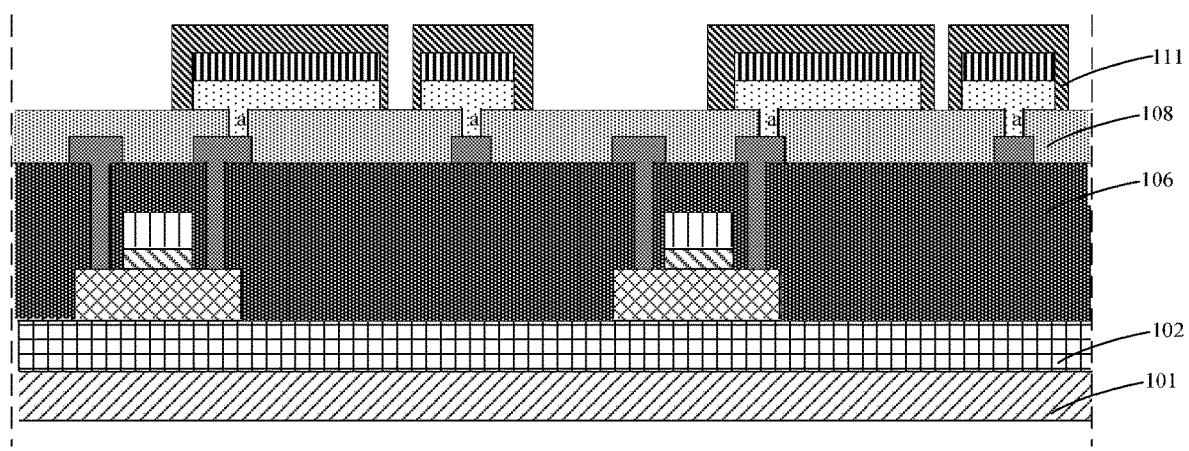

As shown in FIG. 17, patterning the second passivation layer 111 to leave a region covering the metal electrode 32 and the metal common electrode 34.

Figure 18:
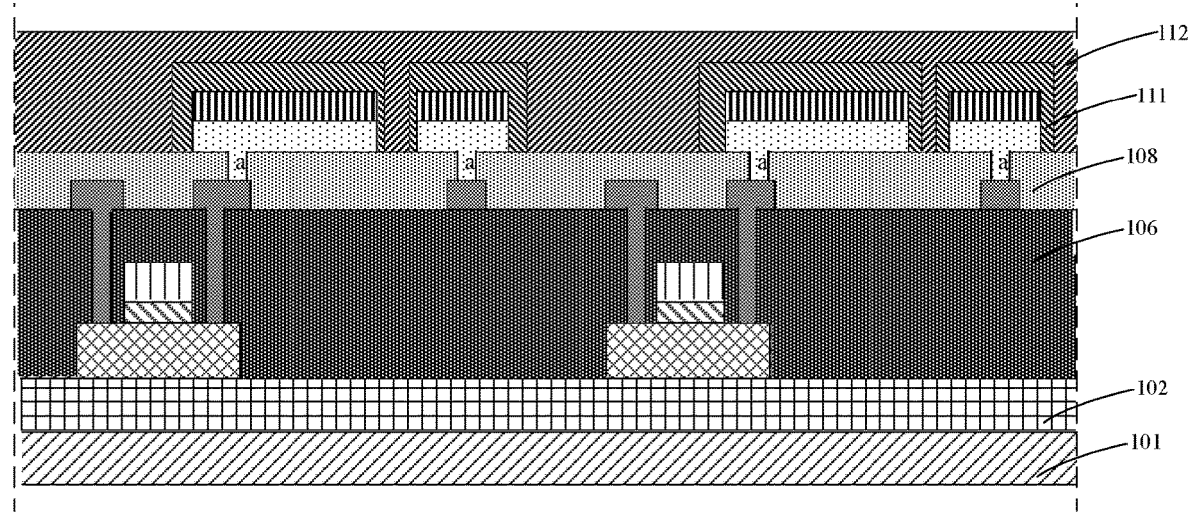

As shown in FIG. 18, depositing a light shielding layer 112 on the first passivation layer 108 and the second passivation layer 111.

The light shielding layer 112 may be composed of a black photoresist, an opaque metal, or the like.

Figure 19:
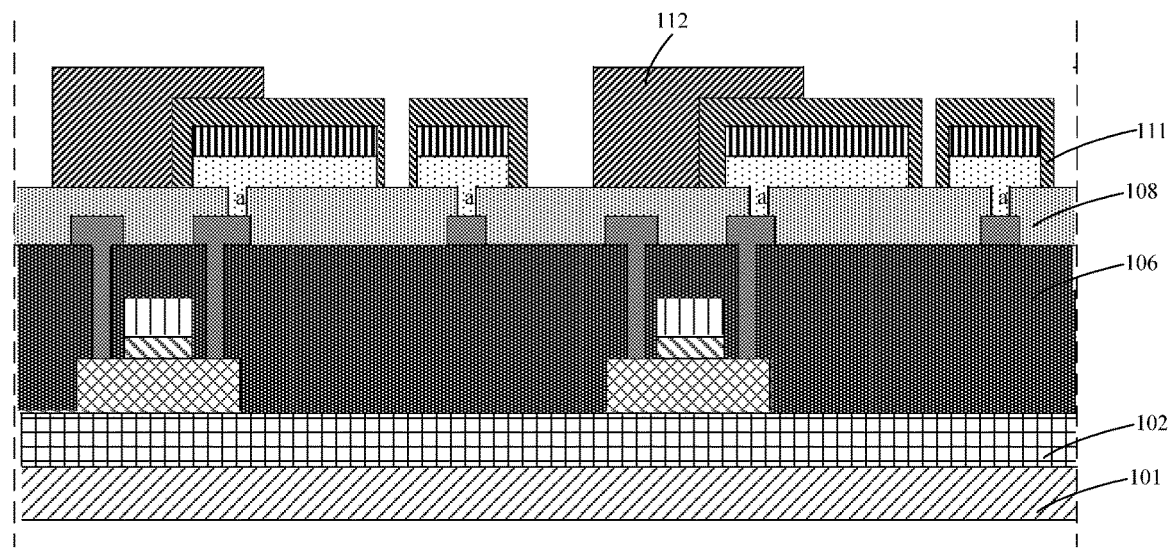

As shown in FIG. 19, patterning the light shielding layer 112 to leave a region covering the active layer 21, the gate insulating layer 22, the gate electrode 23, the source electrode 24, and the drain electrode 25.

Figure 20:
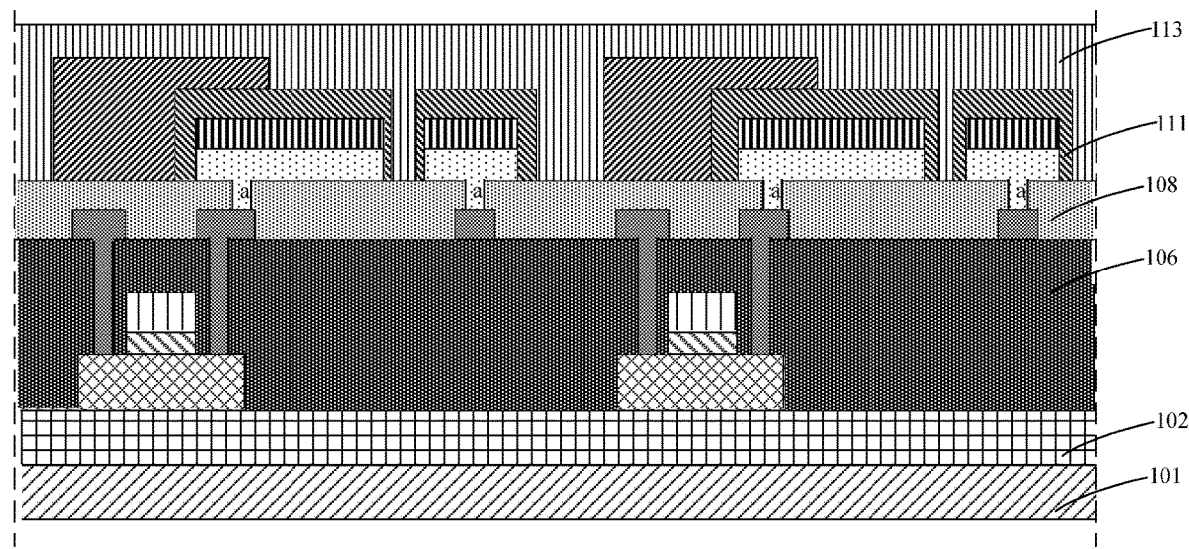

As shown in FIG. 20, depositing a third passivation layer 113 on the first passivation layer 108, the second passivation layer 111, and the light shielding layer 112.

The third passivation layer 113 may be composed of silicon oxide, silicon nitride, aluminum oxide, a silicon nitride/silicon oxide stack, or the like.

Figure 21:
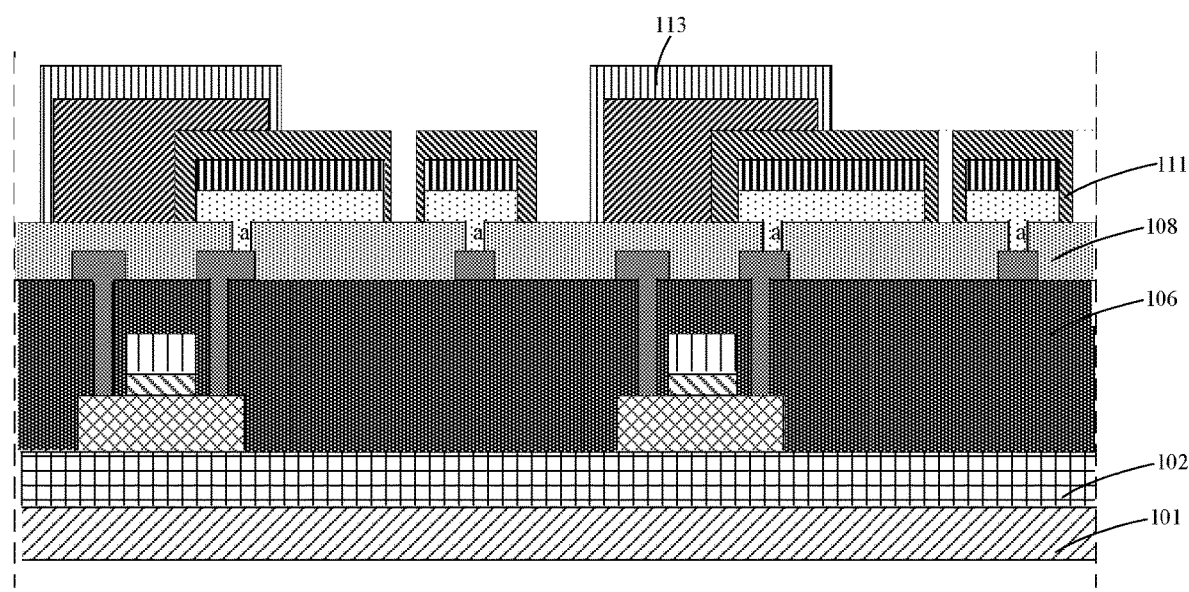

As shown in FIG. 21, patterning the third passivation layer 113 to leave a region covering the light shielding layer 112.

Figure 22:
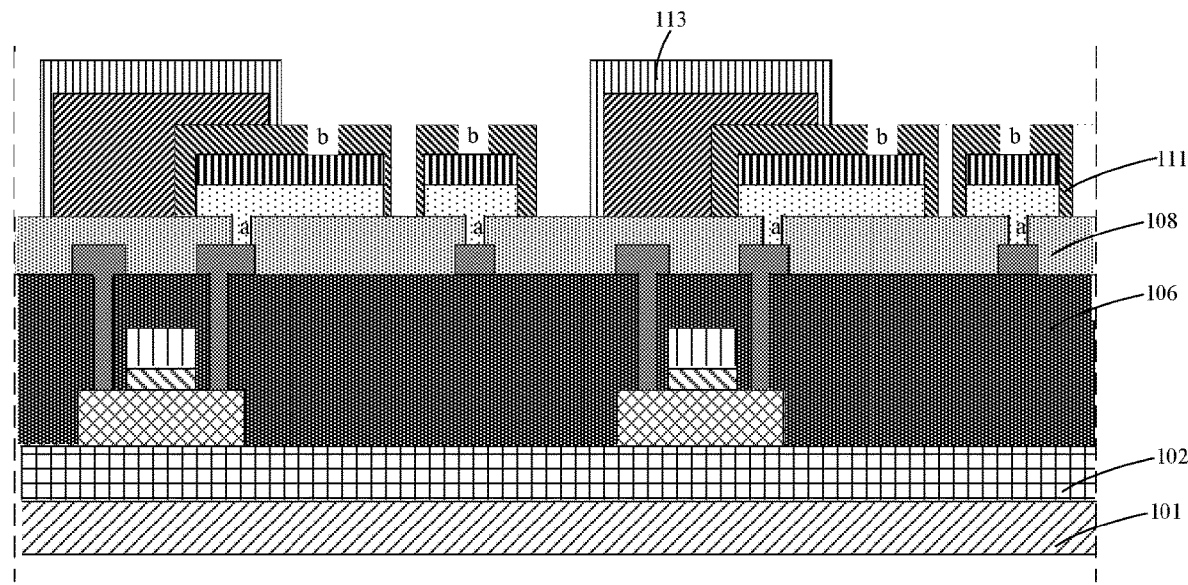

As shown in FIG. 22, patterning the second passivation layer 111 to form second via holes b corresponding to the metal electrode 32 and the metal common electrode 34.

Figure 23:
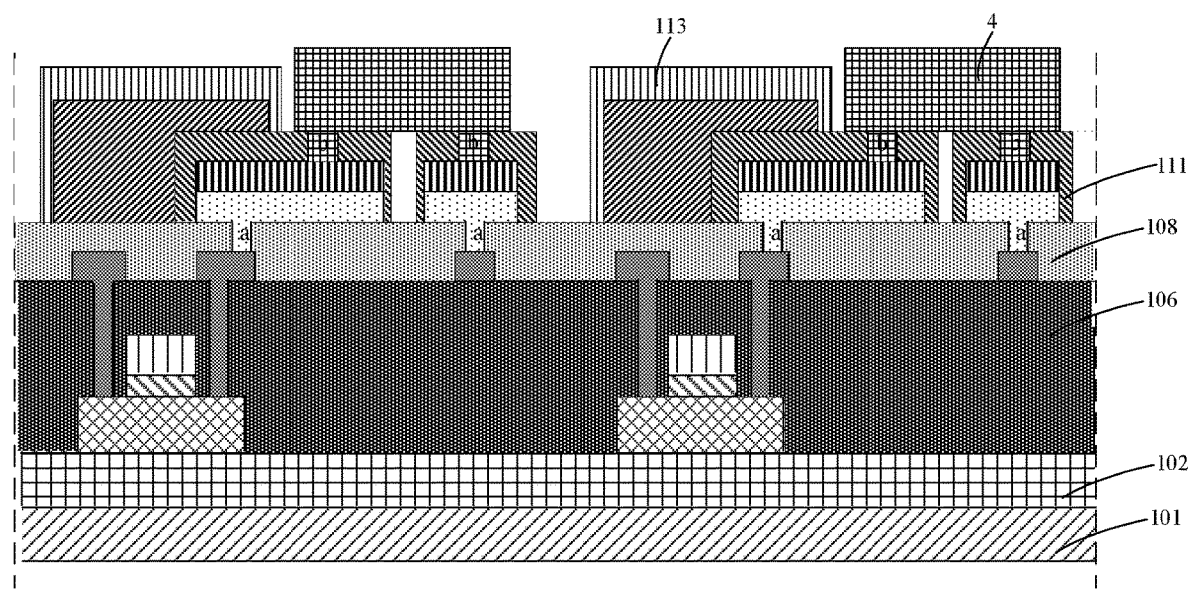

As shown in FIG. 23, bonding a micro light emitting diode 4.

A first electrode of the micro light-emitting diode 4 is connected to the metal electrode 32 through one of the second via holes b, and a second electrode of the micro light-emitting diode 4 is connected to the metal common electrode 32 through the other second via hole b.

Figure 24:
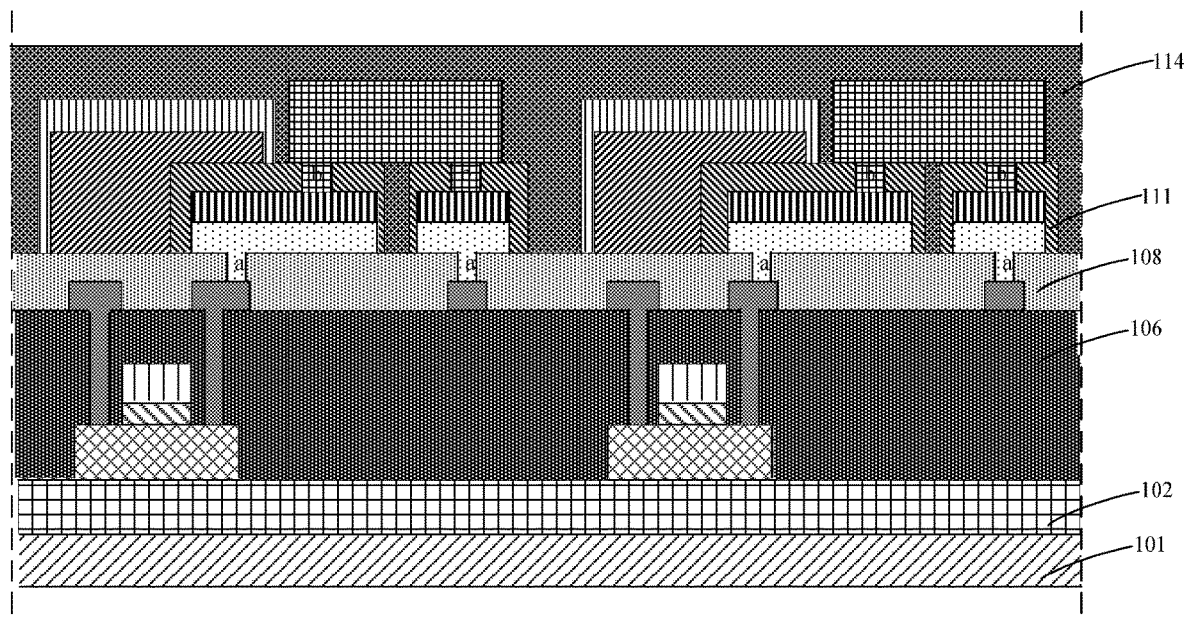

As shown in FIG. 24, depositing a transparent encapsulation layer 114 on the first passivation layer 108, the second passivation layer 111, and the micro-light-emitting diode 4.

The encapsulation layer 114 may be an organic/inorganic alternately deposited water and oxygen-proof mechanical collision protection film or the like.

Other embodiments of the present disclosure will be described with reference to FIGS. 25-29.

In micro light emitting diode display panels shown in FIGS. 25-29, layers and members names corresponding to the same reference numerals are identical to that of the micro light-emitting diode display panel shown in FIG. 1.

Figure 25:
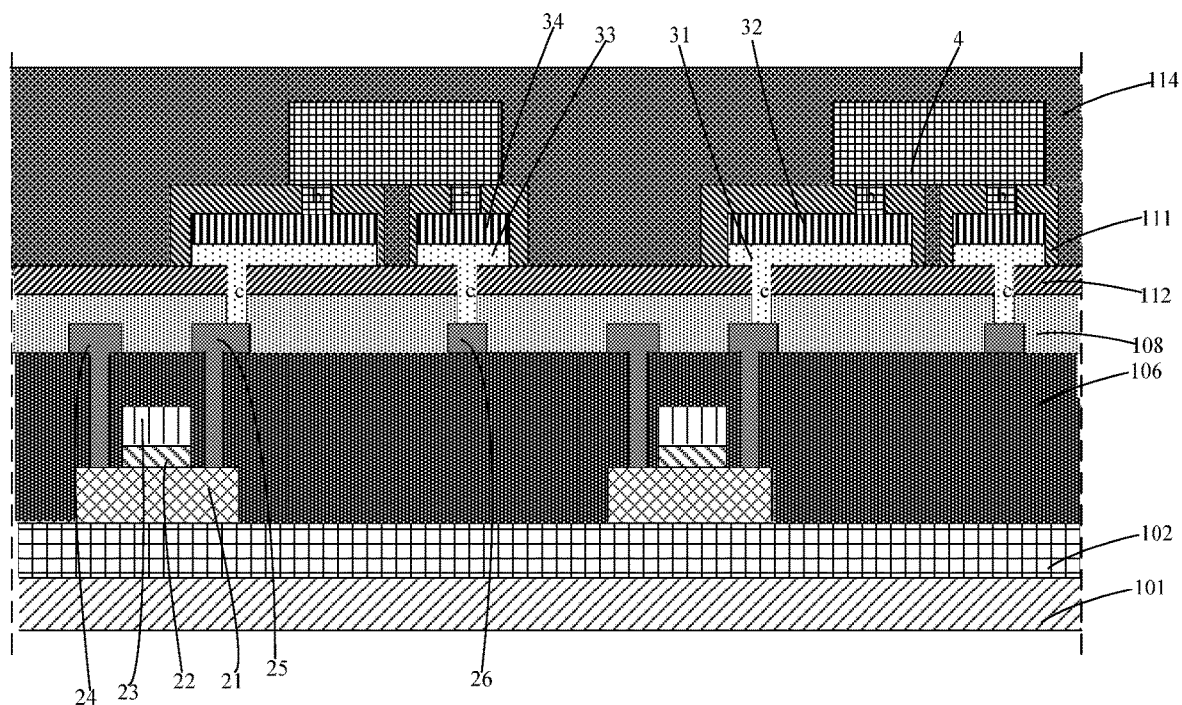
FIG. 25 is a cross-sectional side view of a second structure of a micro light emitting diode display panel according to an embodiment of the present disclosure.

In an embodiment, as shown in FIG. 25, the light shielding layer 112 is disposed on the first passivation layer 108. The pixel electrode 31 is disposed on the light shielding layer 112. The pixel electrode 31 is connected to the drain electrode 25 or the source electrode 24 (not shown in FIG. 25) through a via hole c penetrating the light shielding layer 112 and the first passivation layer 108.

In order to obtain the micro light emitting diode display panel shown in FIG. 25, the present disclosure provides a method for fabricating a micro light emitting diode display panel comprising the following steps:

providing a substrate 101;

forming an active layer 21, a gate insulating layer 22, a gate electrode 23, a source electrode 24, and a drain electrode 25 in sequence on the substrate 101;

forming a first passivation layer 108 above the substrate 101, wherein the first passivation layer 108 covers the source electrode 24 and the drain electrode 25;

forming a light shielding layer 112 on the first passivation layer 108;

processing the first passivation layer 108 and the light shielding layer 112 to form a third via hole c;

forming a pixel electrode 31 on the light shielding layer 112, wherein the pixel electrode 31 is connected to the drain electrode 25 or the source electrode 24 through the third via hole c which comprises the first via hole a of the first passivation layer 108 shown in FIG. 1; and disposing a micro light emitting diode 4 above the substrate 101, wherein the micro light emitting diode 4 is connected to the pixel electrode 31.

Figure 26:
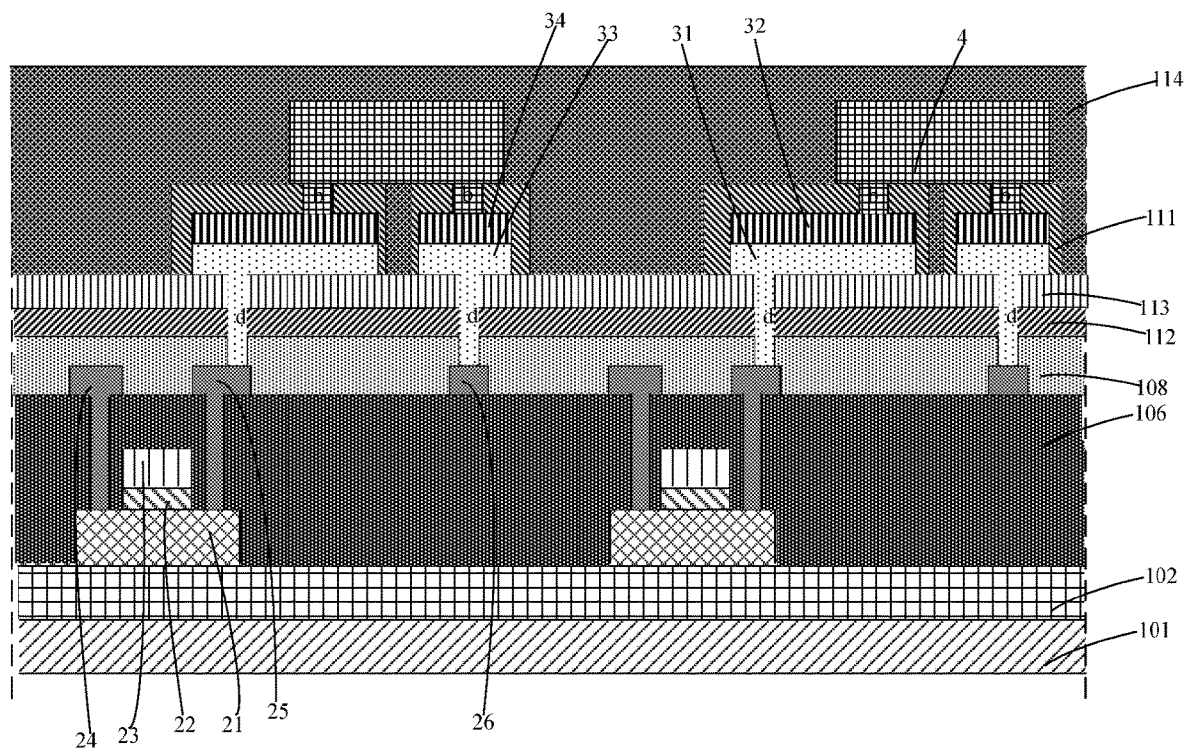
FIG. 26 is a cross-sectional side view of a third structure of a micro light emitting diode display panel according to an embodiment of the present disclosure.

In an embodiment, as shown in FIG. 26, the micro light emitting diode display panel further comprises a third passivation layer 113 disposed on the light shielding layer 112. The pixel electrode 31 is disposed on the third passivation layer 113 and connected to the drain electrode 25 through a via hole d penetrating through the third passivation layer 113, the light shielding layer 112, and the first passivation layer 108.

In order to obtain the micro light emitting diode display panel shown in FIG. 26, the present disclosure provides a method for fabricating a micro light emitting diode display panel comprising the following steps:

providing a substrate 101;

forming an active layer 21, a gate insulating layer 22, a gate electrode 23, a source electrode 24, and a drain electrode 25 in sequence on the substrate 101;

forming a first passivation layer 108 above the substrate 101, wherein the first passivation layer 108 covers the source electrode 24 and the drain electrode 25;

forming a light shielding layer 112 on the first passivation layer 108;

forming a third passivation layer 113 on the light shielding layer 112;

processing the first passivation layer 108, the third passivation layer 113 and the light shielding layer 112 to form a fourth via hole d;

forming a pixel electrode 31 on the light shielding layer 112, wherein the pixel electrode 31 is connected to the drain electrode 25 or the source electrode 24 through the fourth via hole d which comprises the first via hole a of the first passivation layer 108 shown in FIG. 1; and disposing a micro light emitting diode 4 above the substrate 101, wherein the micro light emitting diode 4 is connected to the pixel electrode 31.

Figure 27:
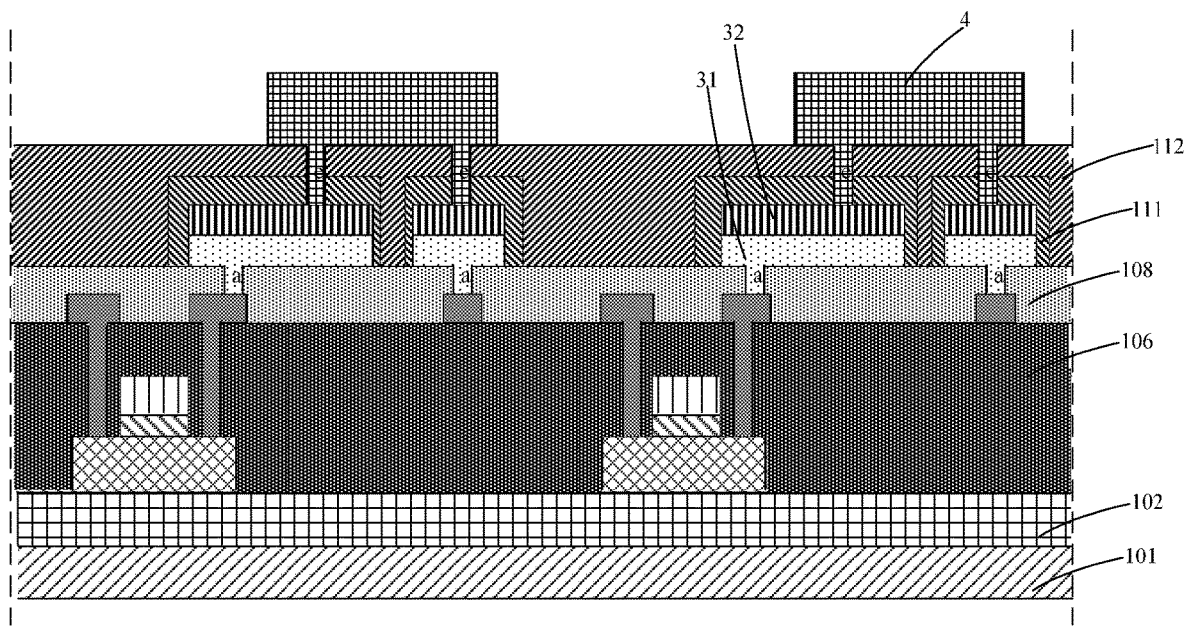
FIG. 27 is a cross-sectional side view of a fourth structure of a micro light emitting diode display panel according to an embodiment of the present disclosure.

In an embodiment, as shown in FIG. 27, the light shielding layer 112 is disposed on the first passivation layer 108 and the second passivation layer 111. The micro light emitting diode 4 is connected to the pixel electrode 31 through a fifth via hole e penetrating through the light shielding layer 112 and the second passivation layer 111.

In order to obtain the micro light emitting diode display panel shown in FIG. 27, the present disclosure provides a method for fabricating a micro light emitting diode display panel comprising the following steps:

providing a substrate 101;

forming an active layer 21, a gate insulating layer 22, a gate electrode 23, a source electrode 24, and a drain electrode 25 in sequence on the substrate 101;

forming a first passivation layer 108 above the substrate 101, wherein the first passivation layer 108 covers the source electrode 24 and the drain electrode 25 and is provided with a first via hole a;

forming a pixel electrode 31 on the first passivation layer 108;

forming a light shielding layer 112 on the pixel electrode 31;

processing the light shielding layer 112 to form a fifth via hole e; and disposing a micro light emitting diode 4 on the light shielding layer 112, wherein the micro light emitting diode is connected to the pixel electrode 31 through the fifth via hole e.

Figure 28:
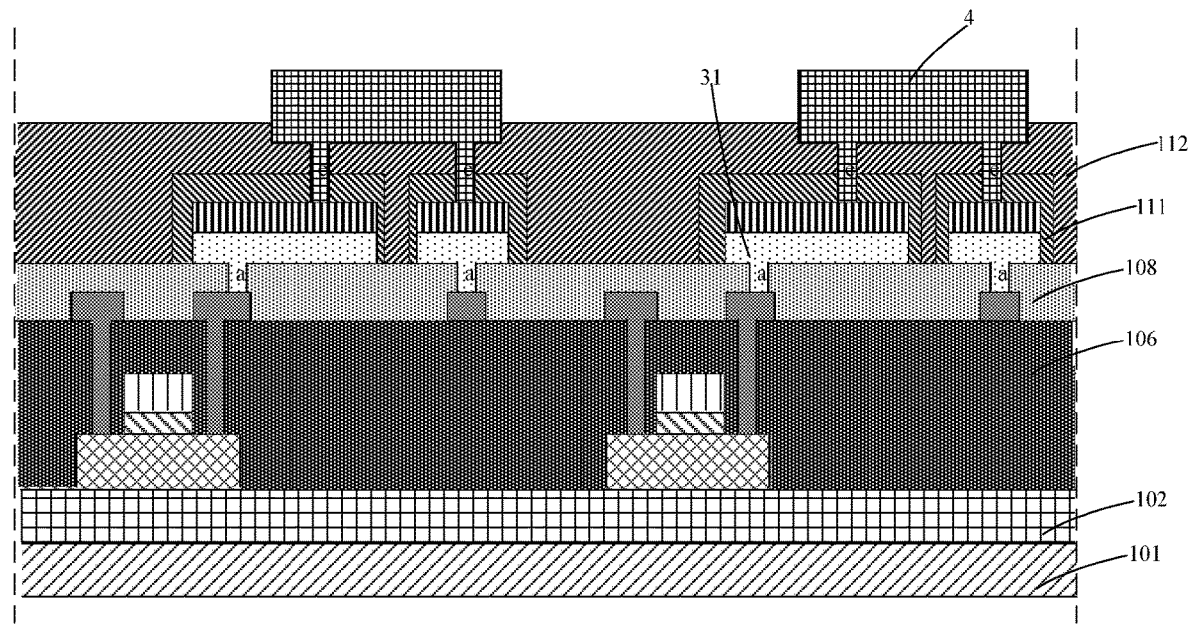
FIG. 28 is a cross-sectional side view of a fifth structure of a micro light emitting diode display panel according to an embodiment of the present disclosure.

In an embodiment, as shown in FIG. 28, the light shielding layer 112 is disposed on the first passivation layer 108 and the second passivation layer 111. The light shielding layer 112 is provided with a groove on the pixel electrode 31. The micro light emitting diode 4 is disposed in the groove and is connected to the pixel electrode 31 through a fifth via hole e penetrating the light shielding layer 112 and the second passivation layer 111.

In order to obtain the micro light emitting diode display panel shown in FIG. 28, the present disclosure provides a method for fabricating a micro light emitting diode display panel comprising the following steps:

providing a substrate 101;
forming an active layer 21, a gate insulating layer 22, a gate electrode 23, a source electrode 24, and a drain electrode 25 in sequence on the substrate 101;
forming a first passivation layer 108 above the substrate 101, wherein the first passivation layer 108 covers the source electrode 24 and the drain electrode 25 and is provided with a first via hole a;
forming a pixel electrode 31 on the first passivation layer 108;
forming a light shielding layer 112 on the pixel electrode 31;
processing the light shielding layer 112 to form a groove and a fifth via hole e; and
disposing a micro light emitting diode 4 in the groove of the light shielding layer 112, wherein the micro light emitting diode is connected to the pixel electrode 31 through the fifth via hole e.

In an embodiment, as shown in FIG. 28, the micro light emitting diode display panel further comprises a third passivation layer 113 disposed on the light shielding layer 112. The micro light emitting diode 4 is connected to the pixel electrode 31 through a sixth via hole f penetrating the third passivation layer 113, the light shielding layer 112, and the second passivation layer 111.

Figure 29:
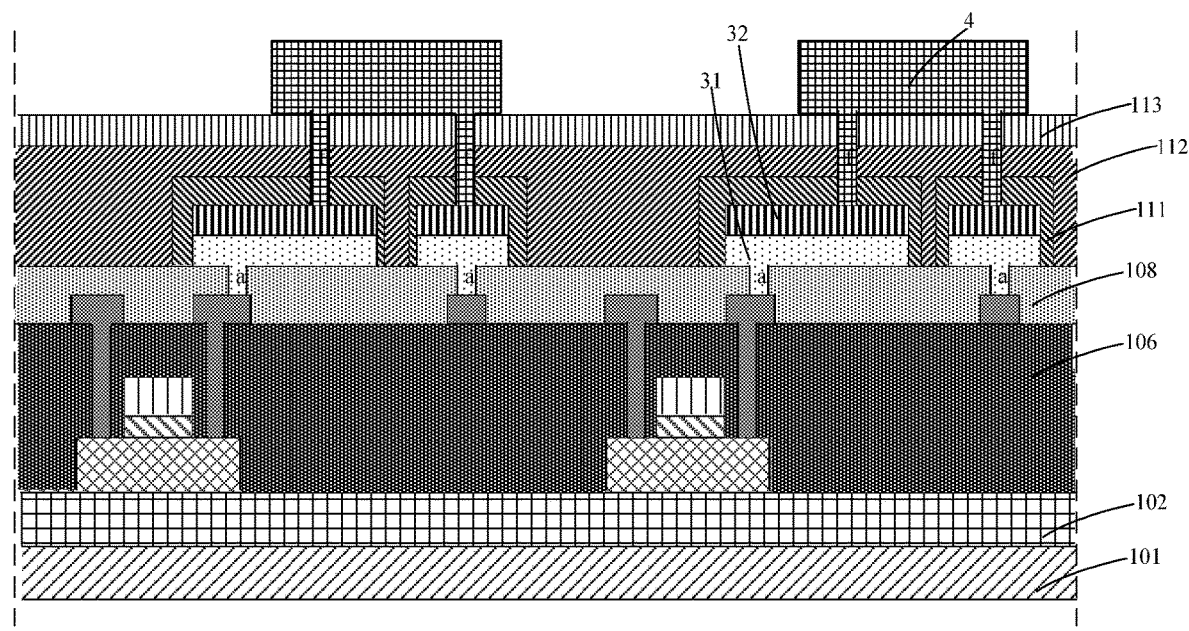
FIG. 29 is a cross-sectional side view of a sixth structure of a micro light emitting diode display panel according to an embodiment of the present disclosure.

In order to obtain the micro light emitting diode display panel shown in FIG. 29, the present disclosure provides a method for fabricating a micro light emitting diode display panel comprising the following steps:

providing a substrate 101;
forming an active layer 21, a gate insulating layer 22, a gate electrode 23, a source electrode 24, and a drain electrode 25 in sequence on the substrate 101;
forming a first passivation layer 108 above the substrate 101, wherein the first passivation layer 108 covers the source electrode 24 and the drain electrode 25 and is provided with a first via hole a;
forming a pixel electrode 31 on the first passivation layer 108;
forming a light shielding layer 112 on the pixel electrode 31;
forming a third passivation layer 113 on the light shielding layer 112;
processing the light shielding layer 112 and the third passivation layer 113 to form a sixth via hole f; and
disposing a micro light emitting diode 4 on the light shielding layer 112, wherein the micro light emitting diode 4 is connected to the pixel electrode 31 through the sixth via hole f.

The present disclosure further provides a display device, comprising:

a micro light emitting diode display panel, comprising:
a substrate;
an active layer disposed on the substrate;
a gate insulating layer disposed on the active layer;
a gate electrode disposed on the gate insulating layer;
a source electrode disposed on the active layer;
a drain electrode disposed on the active layer;
a first passivation layer covering the source electrode and the drain electrode, wherein the first passivation layer is provided with a first via hole;
a pixel electrode connected to the drain electrode or the source electrode through the first via hole;
a light shielding layer covering the active layer, the gate insulating layer, the gate electrode, the source electrode, and the drain electrode; and
a micro light emitting diode connected to the pixel electrode.

In an embodiment, the micro light emitting diode display panel further comprising: a second passivation layer disposed on the pixel electrode, provided with a second via hole, wherein the micro light emitting diode is connected to the pixel electrode through the second via hole.

In an embodiment, the micro light emitting diode display panel further comprising: a metal electrode disposed on the pixel electrode, wherein the micro light emitting diode is connected to the pixel electrode through the second via hole and the metal electrode.

In an embodiment, the micro light emitting diode display panel further comprising: a third passivation layer disposed on the light shielding layer, covering the light shielding layer and a portion of the second passivation layer.

In an embodiment, a projection of the pixel electrode on the substrate coincides with that of the source electrode or the drain electrode on the substrate, and the light shielding layer covers a portion of the second passivation layer.

In an embodiment, the light shielding layer is composed of a black photoresist.

In an embodiment, the light shielding layer is disposed on the first passivation layer, and the pixel electrode is disposed on the light shielding layer and is connected to the drain electrode or the drain electrode through a via hole penetrating the light shielding layer and the first passivation layer.

In an embodiment, the light shielding layer is disposed on the first passivation layer and the second passivation layer, and the micro light emitting diode is connected to the pixel electrode through a via hole penetrating the light shielding layer and the second passivation layer.

In an embodiment, the light shielding layer is provided with a groove on the pixel electrode, and the micro light emitting diode is disposed in the groove.

The present disclosure provides a micro light emitting diode display panel, a method for fabricating the same, and a display device comprising the same. The micro light emitting diode display panel comprises an active layer, a gate insulating layer, a gate electrode, a source electrode, a drain electrode, a pixel electrode, a micro light emitting diode, and a gate insulating layer. The active layer, the gate insulating layer, the gate electrode, the source electrode, and the drain electrode form a thin film transistor and are covered by the light shielding layer. The light shielding layer blocks light emitted by the micro light emitting diode from being incident on the thin film transistor, thereby reducing influence of the light emitted by the micro light emitting diode light on the thin film transistor, that is, reducing a shift in threshold voltage (Vth) caused by the micro light emitting diode illuminating the thin film transistor, and then reducing a light leakage current. Therefore, the technical problem of the current micro light emitting diode display panel that the light emitted by the micro light emitting diode causes the shift of the threshold voltage of the thin film transistor is solved, the light leakage current is reduced when the thin film transistor is turned off, and contrast between bright and dark is improved.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A method for fabricating a micro light emitting diode display panel, comprising:
    providing a substrate;
    forming an active layer, a gate insulating layer, a gate electrode, a source electrode, and a drain electrode on the substrate in sequence;
    forming a first passivation layer above the substrate, wherein the first passivation layer is provided with a first via hole and covers the source electrode and the drain electrode;
    forming a pixel electrode above the substrate, wherein the pixel electrode is connected to the drain electrode or the source electrode through the first via hole;
    forming a second passivation layer on the pixel electrode, wherein the second passivation layer is provided with a second via hole;
    forming a light shielding layer above the substrate, wherein the light shielding layer covers the active layer, the gate insulating layer, the gate electrode, the source electrode, and the drain electrode; and
    disposing a micro light emitting diode above the substrate, wherein the micro light emitting diode is connected to the pixel electrode through the second via hole.

2. The method for fabricating a micro light emitting diode display panel according to claim 1, further comprising:
    forming a metal electrode on the pixel electrode before the step of forming the second passivation layer on the pixel electrode, wherein the micro light emitting diode is connected to the pixel electrode through the second via hole and the metal electrode.

3. The method for fabricating a micro light emitting diode display panel according to claim 1, further comprising:
    forming a third passivation layer on the light shielding layer after the step of forming the light shielding layer above the substrate, wherein the third passivation layer covers the light shielding layer and a portion of the second passivation layer.

4. A micro light emitting diode display panel, comprising:
    a substrate;
    an active layer disposed on the substrate;
    a gate insulating layer disposed on the active layer;
    a gate electrode disposed on the gate insulating layer;
    a source electrode disposed on the active layer;
    a drain electrode disposed on the active layer;
    a first passivation layer covering the source electrode and the drain electrode, wherein the first passivation layer is provided with a first via hole;
    a pixel electrode connected to the drain electrode or the source electrode through the first via hole;
    a second passivation layer disposed on the pixel electrode and provided with a second via hole;
    a light shielding layer covering the active layer, the gate insulating layer, the gate electrode, the source electrode, and the drain electrode; and
    a micro light emitting diode connected to the pixel electrode through the second via hole.

5. The micro light emitting diode display panel according to claim 4, further comprising:
    a metal electrode disposed on the pixel electrode, wherein the micro light emitting diode is connected to the pixel electrode through the second via hole and the metal electrode.

6. The micro light emitting diode display panel according to claim 4, further comprising:
    a third passivation layer disposed on the light shielding layer, covering the light shielding layer and a portion of the second passivation layer.

7. The micro light emitting diode display panel according to claim 4, wherein a projection of the pixel electrode on the substrate coincides with that of the source electrode or the drain electrode on the substrate, and the light shielding layer covers a portion of the second passivation layer.

8. The micro light emitting diode display panel according to claim 4, wherein the light shielding layer is composed of a black photoresist.

9. The micro light emitting diode display panel according to claim 4, wherein the light shielding layer is disposed on the first passivation layer, and the pixel electrode is disposed on the light shielding layer and is connected to the drain electrode or the drain electrode through a via hole penetrating the light shielding layer and the first passivation layer.

10. The micro light emitting diode display panel according to claim 4, wherein the light shielding layer is disposed on the first passivation layer and the second passivation layer, and the micro light emitting diode is connected to the pixel electrode through a via hole penetrating the light shielding layer and the second passivation layer.

11. The micro light emitting diode display panel according to claim 10, wherein the light shielding layer is provided with a groove on the pixel electrode, and the micro light emitting diode is disposed in the groove.

12. A display device, comprising a micro light emitting diode display panel, wherein the micro light emitting diode display panel comprises:
    a substrate;
    an active layer disposed on the substrate;
    a gate insulating layer disposed on the active layer;
    a gate electrode disposed on the gate insulating layer;
    a source electrode disposed on the active layer;
    a drain electrode disposed on the active layer;
    a first passivation layer covering the source electrode and the drain electrode, wherein the first passivation layer is provided with a first via hole;
    a pixel electrode connected to the drain electrode or the source electrode through the first via hole;
    a second passivation layer disposed on the pixel electrode and provided with a second via hole;
    a light shielding layer covering the active layer, the gate insulating layer, the gate electrode, the source electrode, and the drain electrode; and
    a micro light emitting diode connected to the pixel electrode through the second via hole.

13. The display device according to claim 12, wherein the micro light emitting diode display panel further comprising:
    a metal electrode disposed on the pixel electrode, wherein the micro light emitting diode is connected to the pixel electrode through the second via hole and the metal electrode.

14. The display device according to claim 12, wherein the micro light emitting diode display panel further comprising:
   a third passivation layer disposed on the light shielding layer, covering the light shielding layer and a portion of the second passivation layer.

15. The display device according to claim 12, wherein a projection of the pixel electrode on the substrate coincides with that of the source electrode or the drain electrode on the substrate, and the light shielding layer covers a portion of the second passivation layer.

16. The display device according to claim 12, wherein the light shielding layer is disposed on the first passivation layer, and the pixel electrode is disposed on the light shielding layer and is connected to the drain electrode or the drain electrode through a via hole penetrating the light shielding layer and the first passivation layer.

17. The display device according to claim 12, wherein the light shielding layer is disposed on the first passivation layer and the second passivation layer, and the micro light emitting diode is connected to the pixel electrode through a via hole penetrating the light shielding layer and the second passivation layer.

* * * * *